United States Patent [19]

Kilpinen

[11] 4,123,009

[45] Oct. 31, 1978

[54] LOAD SENSOR FOR A GRINDING MILL

[75] Inventor: Leo T. Kilpinen, Sudbury, Canada

[73] Assignee: The International Nickel Company, Inc., New York, N.Y.

[21] Appl. No.: 670,414

[22] Filed: Mar. 25, 1976

Related U.S. Application Data

[63] Continuation-in-part of Ser. No. 470,169, May 14, 1974, abandoned.

[51] Int. Cl.[2] .......................... B02C 4/04; H02P 3/00; G01R 31/02

[52] U.S. Cl. .......................................... 241/30; 241/34; 241/36; 318/490; 324/158 MG

[58] Field of Search ................ 324/158 MG; 318/490, 318/638; 241/34, 35, 33, 37, 32, 36, 30; 340/259

[56] References Cited

U.S. PATENT DOCUMENTS

| | | | |
|---|---|---|---|
| 2,654,860 | 10/1953 | Lewis | 318/490 |
| 3,050,264 | 8/1962 | Marcyes et al. | 241/34 |
| 3,555,537 | 1/1971 | Windley | 340/259 |

OTHER PUBLICATIONS

Roumanis, S. J.; "The Null Point Method . . ."; AIEE Transactions; Apr. 1956; pp. 147-152.

*Primary Examiner*—Rudolph V. Rolinec
*Assistant Examiner*—Ernest F. Karlsen
*Attorney, Agent, or Firm*—Ewan C. MacQueen; Raymond J. Kenny; Miriam W. Leff

[57] ABSTRACT

A method and apparatus for detecting predetermined operating conditions of a machine driven by an electric motor, in which a filtered electric signal is utilized. The filter is designed to signal the occurrence of frequencies within a predetermined band, thereby enabling detection of an event characterized by the occurrence of such frequencies. The output of the filter can be used, for example, in a further device to operate an alarm, turn off the motor, reduce the feed to the machine, or any other suitable control action.

4 Claims, 5 Drawing Figures

LOAD SENSOR FOR A GRINDING MILL

This application is a continuation-in-part of application Ser. No. 470,169, filed May 14, 1974, now abandoned.

This invention relates to a method and apparatus for detecting predetermined operating conditions of a machine driven by an electric motor.

BACKGROUND OF THE INVENTION

Many types of machines may be driven by electric motors. In some cases, the machine can encounter undesirable operating conditions while the motor continues turning as though nothing had happened. While these undesirable conditions, such as a broken connection or overloading of the machine may be readily detectable visually or aurally, this requires the presence of an operator or supervisor and is undesirable when it is desired to have a largely automated plant with many machines controlled or supervised from a central console.

The problem may perhaps be better appreciated if a specific example is considered and a good example is a rod mill. A rod mill comprises a large, horizontally-disposed, cylindrical drum which contains numerous steel rods extending lengthwise of the drum. The drum may be approximately half-full of these rods. Into one end of the drum there is introduced crushed ore (to be further crushed), water, and possibly "fines", i.e., finely divided ore material. The drum is continuously rotated by a large electric motor and the inside of the drum is normally corrugated. As the drum rotates, the rods tend to ride up with the drum but eventually, during normal operation, they will roll or slide down. This action crushes the ore which eventually leaves the other end of the drum in a continuous process. Now it can be appreciated that if the mill is lightly loaded, the mass of rods will only "ride up" a relatively small amount but with the addition of more ore, they will tend to ride up further. If too much ore is introduced, the rods may pass the topmost position and tumble back down getting entangled with the other rods. This is called a "tangle" and is a very undesirable situation as it can require several hours or even several shifts to untangle the rod mill. On the other hand, it is desirable to operate the mill at high capacity and this can be done if the mill is fed with material at the maximum rate which is just short of that which will cause a tangle. It should also be noted that a change in hardness of the ore material can affect the operation of the mill even if there is no change in the rate of feed to it. If the ore material were suddenly to become harder, tangling might result.

It would be highly desirable to remove the conditions which cause the tangle. In fact, a trained operator can tell just by listening when tangling is about to occur and can take corrective measures. Attempts have been made to detect incipient tangling by placing a microphone near the mill and feeding the output of the microphone through an amplifier and filter arrangement to detect the sound characteristic of a rod mill approaching a tangling condition. However, these measures have proved very unreliable, perhaps because of the amplitude and variety of noises encountered around the mill. Attempts have also been made to detect incipient tangling by measuring the average power drawn by the mill motor but these have also been unsuccessful as the variations in power as opposed to changes in frequencies are not very substantial and do not differentiate between incipient tangling and load changing.

It has been found, and the present invention is predicated on the discovery, that the current to the mill motor, normally 60 Hz, has superimposed on it frequencies of significant amplitude in a band of frequencies characteristic of predetermined operating conditions, in this case, incipient tangling. These frequencies would depend on the particular machine. Also, the frequencies superimposed depend on the particular event. In other words, for a particular machine, an incipient tangling superimposes a character band of frequencies on the motor current. This characteristic band of frequencies disappears at the point of actual tangle. A different condition, e.g., a faulty bearing would superimpose another band of frequencies. The event need not be an abnormal operation of the machine. Whatever the event may be, so long as it causes this characteristic change in harmonics of the motor signal, the superimposed frequencies can be identified. It is the occurrence of such characteristic frequencies that is utilized in the present invention. It should be noted that the signal that relates to the event is different from the power signal related to the mechanical load. In the instance of the incipient rod tangle, as indicated above, variations in the power level are not very substantial as opposed to changes in characteristic frequencies.

THE INVENTION

According to the present invention there is provided a method and apparatus for detecting predetermined operating conditions of a machine driven by an electric motor comprising deriving an electrical signal proportional to current drawn by the motor, and filtering out of the signal all frequencies except those in a band of frequencies which occur with relatively large amplitude when the machine encounters said predetermined operating conditions.

In accordance with one aspect of the invention the electrical signal derived from the filter can be utilized to perform a control function. For example, the filter output can be rectified and smoothed to provide a DC voltage whose amplitude depends on the relative amplitudes of frequencies in said band. This DC voltage can be used to operate an alarm, shut off the motor, alter the rate of feed to the machine, or any other appropriate function.

The invention will now be described in detail in conjuntion with the accompanying drawings, in which.

Figure 4:
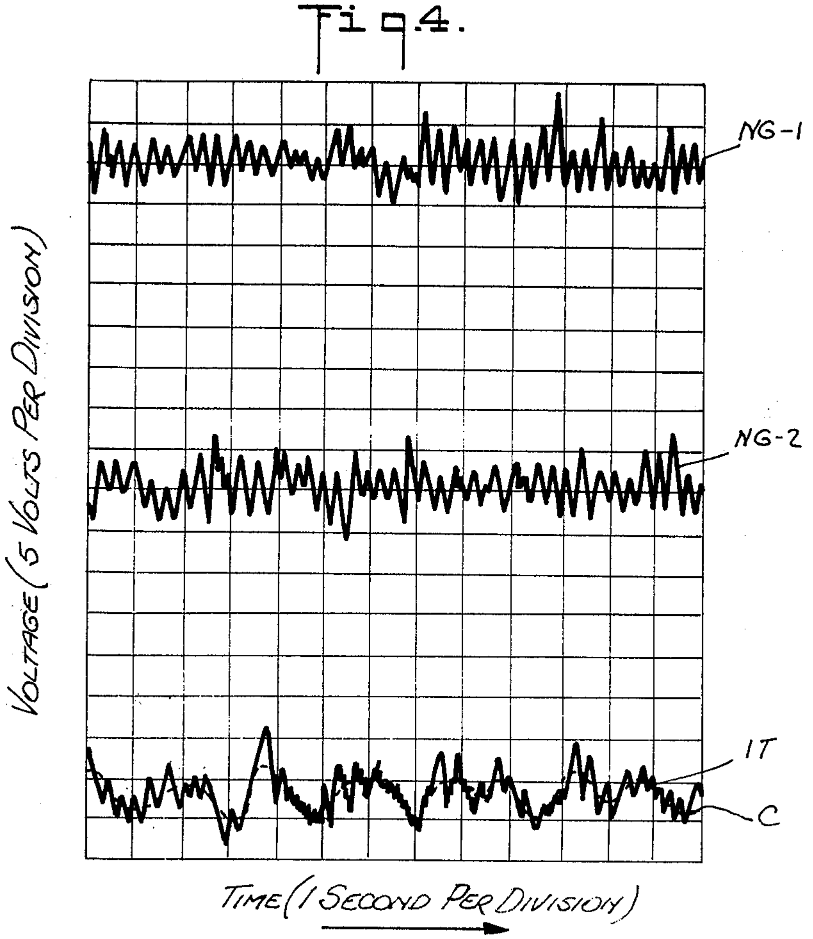
Figure 5:
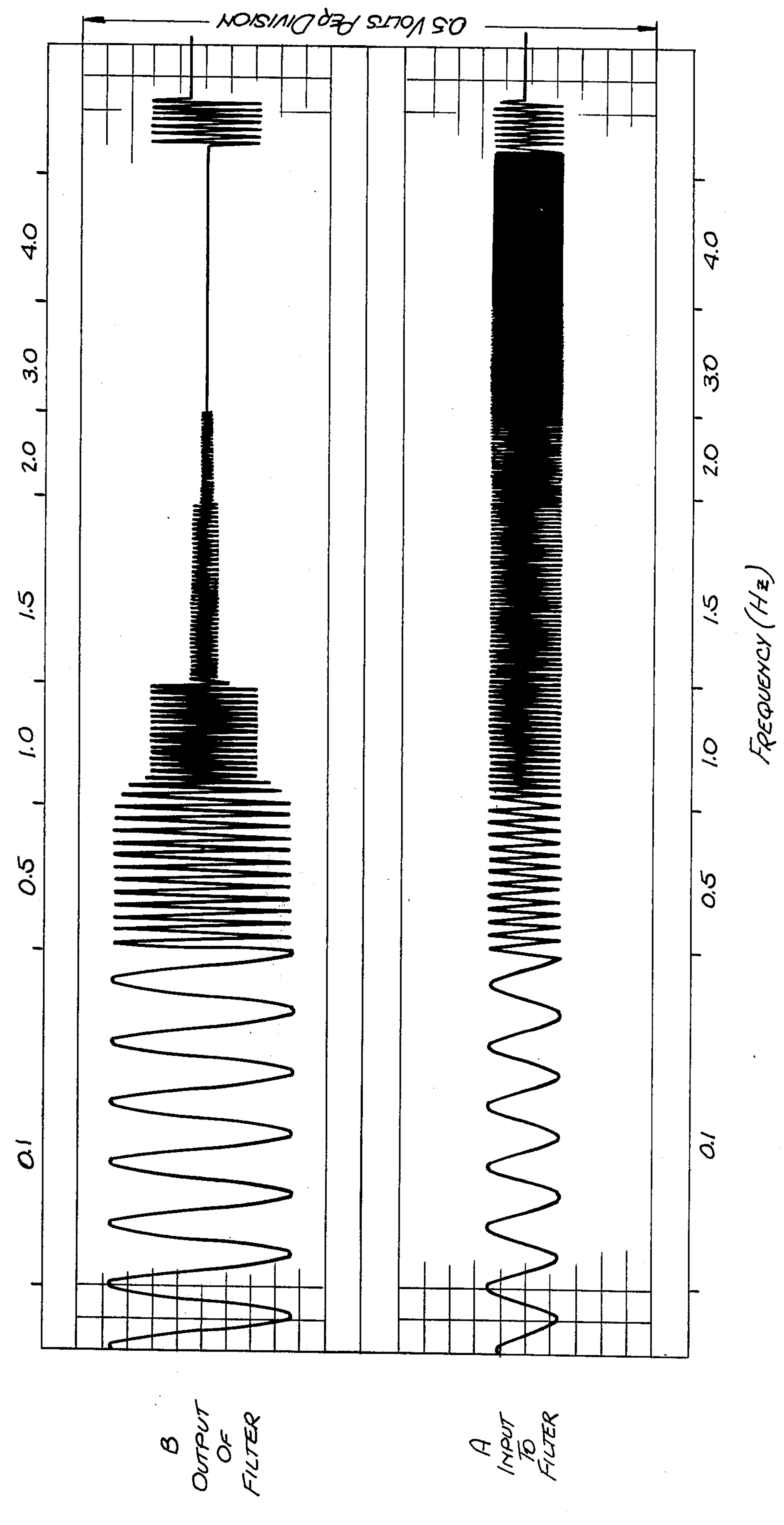

FIG. 4 shows a set of graphs illustrating schematically momentary current variations during the processing of ore in a rod mill. The graphs show disturbances experienced by the electric motor with 60 cycles filtered out. Graphs NG-1 and NG-2 illustrate variations under normal grind and graph IT illustrates the appearance of a low frequency component during incipient tangle; and FIG. 5 illustrates the response of a filter in accordance with the present invention. The filter is designed to signal the occurrence of frequencies within the 0.2 to 1 Hz range. Graph A shows the input to the filter and Graph b shows the output.

Figure 2:
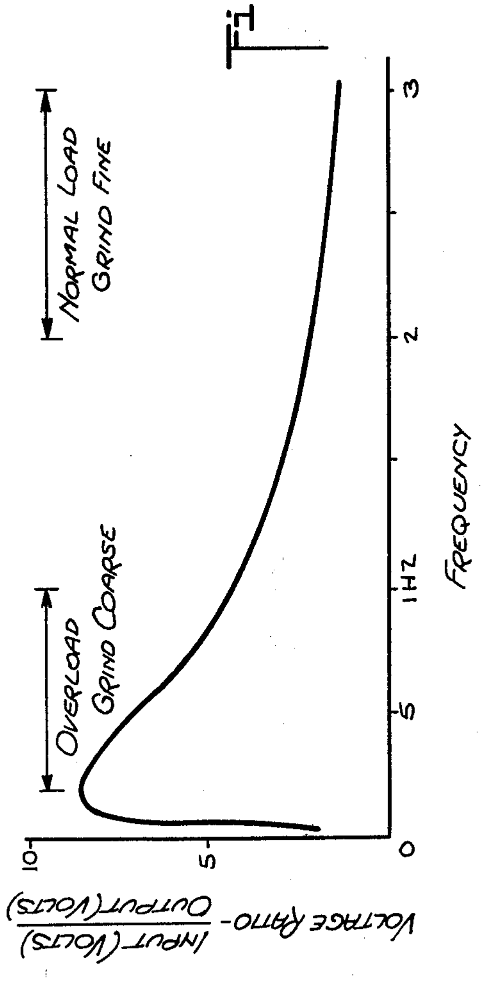
FIG. 2 is a frequency response curve of a frequency discriminator filter useful in an embodiment of the present invention. The curve is useful in explaining the operation of the circuitry of FIG. 1.
Figure 3:
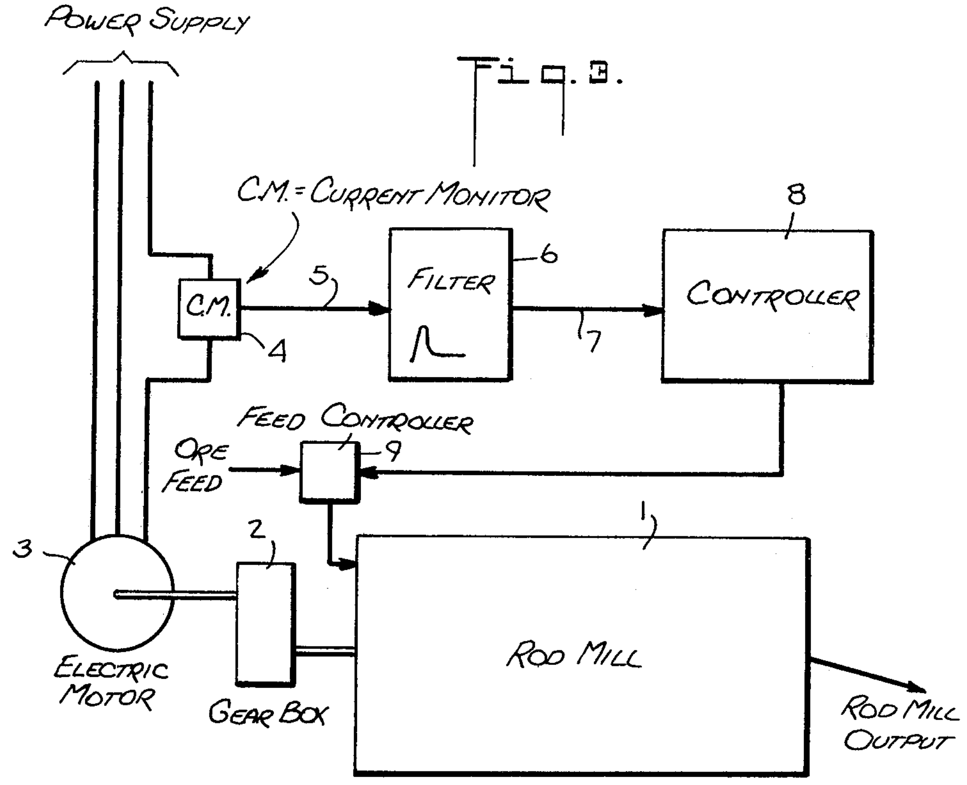
FIG. 3 is a block diagram for a rod mill load sensor in accordance with the present invention, designed for automatic detection and correction of an incipient tangle in the rod mill.

In the block diagram for a load mill sensor illustrated in FIG. 3, a rod mill 1 is in electrical contact and driven by electric motor 3 through gear box 2. Current monitor 4 produces an output signal proportional to the line current drawn by the electric motor 3. This output signal, which has every characteristic of the line current and is only reduced in size, is the input 5 to filter 6, having a specified response e.g., such as illustrated in FIG. 2. The filter output 7 is fed to controller 8. The filter output 7 indicates to controller 8 whether the ore feed should be continued to the rod mill 1. Upon a signal derived through filter 6 that an incipient tangle is in progress, the controller 8 initiates to the control input (not shown) of feed controller 9 the correct output signal such as shut-off of ore feed or increase in water feed to the mill. The shut-off will continue until the filter response corresponds to that for normal grind, meaning the incipient tangle conditions have been corrected, and at such time normal ore feed to the rod mill is permitted.

The present invention is illustrated herein mainly with respect to an ore grinding rod mill having a maximum capacity of 400 tons per hour driven by a 1750 HP, 4160 volt, 3-phase synchronous motor operating on a full load current of 220 amps. The current from the power line is 60 hertz. The tumbling action of the rods within the rotating mill modulates the electric power and current drawn by the mill drive motor.

In seeking out the superimposed frequency at incipient rod tangle it is necessary to predetermine the superimposed frequencies on the motor current which appear on the occurrence of this condition in the rod mill. FIG. 4 shows schematically a set of graphs which illustrate current variations (with the 60 cycle power line filtered out) at normal grind (graphs NG-1 and NG-2) and at incipient tangle (IT). NG-1 illustrates the current variations under normal grind at a feed rate to the mill of about 350 tons per hour and NG-2 illustrates the current variations at about 375 tons per hour. In general, at normal grind the frequencies present in the modulated current to the rod mill described above were determined to be between about 2 and 4 Hz. A superimposed narrow band of low frequencies, viz. in the range of less than 1 Hz, was found to be in present at incipient tangle. The low frequency component of interest appearing at incipient tangle is indicated by curve "C" drawn of the graph IT. A filter having the frequency band pass characteristics of FIG. 2 is useful to detect the occurrence of this low frequency component. It will be noted that having determined—by any suitable means—the incipient tangle frequency, it is not necessary to filter out the power line frequency. The filter attentuates all signals containing high frequency components. It responds only to frequencies within the predetermined band. A filter designed to have the band pass characteristics of FIG. 2, for example, has a maximum response at frequencies centering about 0.4 Hz.

FIG. 5 is a diagram of a filter response in a filter designed to be sensitive to the narrow band of frequencies within about 0.2 to 1 Hz. Graph A of FIG. 5 represents the input to the filter at constant voltage. Graph B, which is on the same scale as Graph A, shows a change in the voltage of the output from the filter as the frquency of the input increases, attenuation of the response starting at about 1 Hz and increasing as the frequency increases until the ratio of input to output about 2 Hz is about 1.

FIG. 2 shows the pass characteristics of the filter of FIG. 5. From FIG. 2, it can be seen that the filter does not pass DC, has a peak output at approximately 0.2 Hz and has an output which drops off rather rapidly to a fairly small value about a few Hz. The output of the filter can be utilized, as indicated above to operate a control device automatically or to signal the impending tangle. Thus, in the machine having the significant band of frequencies for operation of 0.2 to 4 Hz, the problem resolves itself into detecting fequencies in this band and producing a signal to perform a control function.

Figure 1:
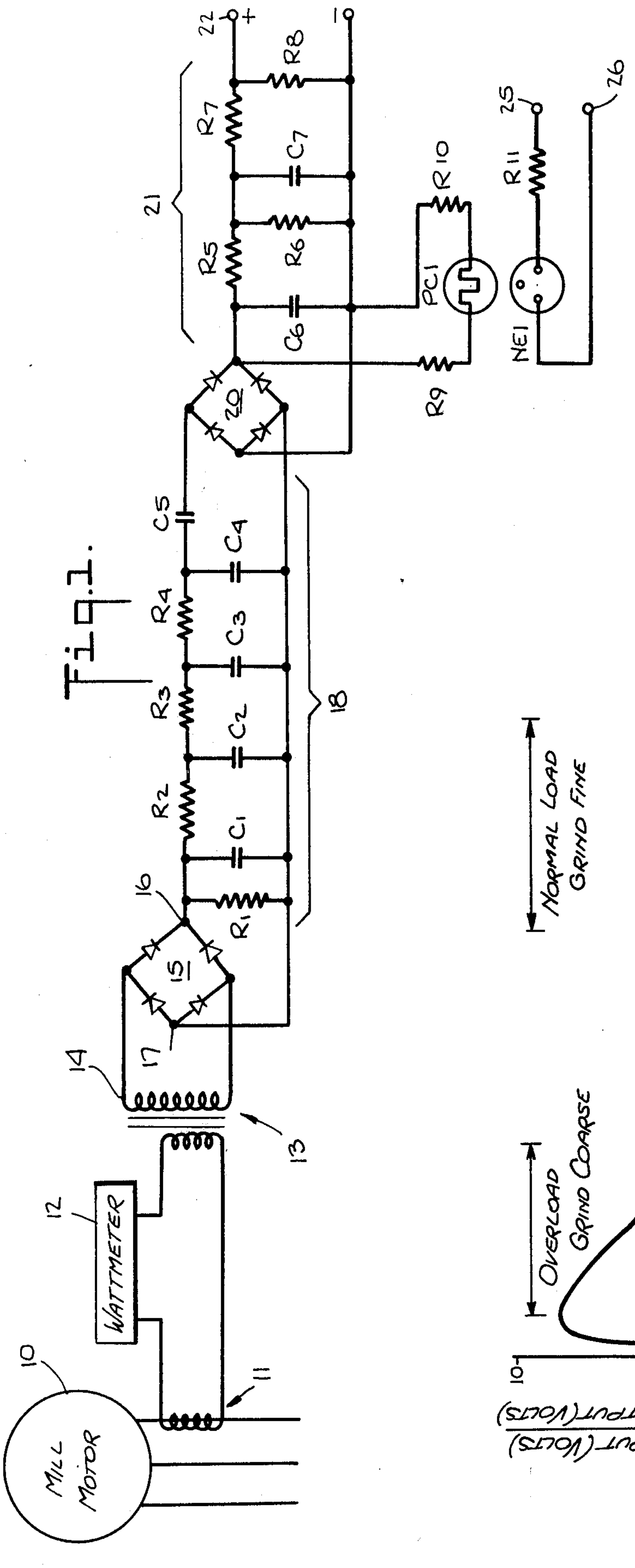
FIG. 1 shows an embodiment of the invention which is particularly useful in detecting incipient tangling of a rod mill.

Referring now to FIG. 1, there is shown a mill motor 10 which drives a rod mill, not shown. The motor here is shown as being a three-phase motor although the principles of the invention are equally applicable to motors of other than three-phase, e.g., single-phase motors. A current transformer 11 derives an electrical signal which is proportional to current drawn by the motor and this signal may feed the current winding of a wattmeter 12, although the wattmeter 12 has nothing to do with the invention per se. This signal is passed to a further current transformer 13 which may, for example, have a turns ratio of 1:100. The secondary winding 14 of the current transformer 13 is fed to a full wave rectifier 15 having output terminals 16 and 17 connected to the input of an RC filter 18 comprising resistors R1 to R4 and capacitors C1 to C5. Note that capacitor C5 blocks DC. This filter 18 has a characteristic as shown in FIG. 2 and its output feeds a further full wave rectifier 20 which in turn feeds a signal conditioner filter 21. Filter 21 smooths the output of rectifier 20 to provide at output terminals 22 and 23 a DC voltage whose amplitude depends on the amplitudes of frequencies in the pass band of the filter 18.

Filter 21 comprises resistors R5 to R8 and capacitors C6 and C7.

During mill start-up, it is possible that capacitor C7 will be charged to a rather high voltage which of course is passed to the output terminals 22 and 23 and this can cause an undesired control action to take place. To avoid this, some measure should be taken to limit the action of the circuit until after start-up. The current transformer 13 can be constructed to limit surge currents but another method is shown here by way of example. Connected across the input of filter stage 21 is a photosensitive resistor PC1 in series with current limiting resistors R9 and R10. A light source, such as a neon bulb (not shown) is located in close proximity to the photosensitive resistor PC1 and reduces its resistance. This tends to discharge the capacitors in filter 21. A control current may be passed through NE1 via resistor R11 from terminals 25 and 26. The control current is passed only during start-up and when removed after start-up, the photosensitive resistor, or equivalent photosensitive device, increases its resistance greatly so that the action of filter stage 21 is substantially not affected.

Persons skilled in the art may well think of other ways of eliminating possible adverse effects during start-up.

Component values for a circuit which has actually been used to provide the pass band characteristics of FIG. 2 are as follows:

| | |
|---|---|
| Capacitors, Microfarads | |
| C1 | .05 |
| C2 | 2 |
| C3 | 2 |
| C4 | 2 |
| C5 | 3 |
| C6 | 20 |
| C7 | 200 |
| Resistors, K ohms | |
| R1 | 22 |
| R2 | 47 |
| R3 | 47 |
| R4 | 47 |
| R5 | 470 |
| R6 | 1000 |
| R7 | 470 |
| R8 | 3.9 |
| R9 | 10 |
| R10 | 10 |
| R11 | 100 |

While passive filtering means has been disclosed, active filters could be used if desired.

It will be noted that the filter sensing devices of the present invention are independant of the particular machines in which they are used in the sense that such filters are not integral with the motor.

In the example given, the frequencies of interest occuring during undesirable operating conditions (incipient tangling) are used to actuate an alarm or control action but, with some machines, it may be useful to use a filter which selects frequencies which occur with relatively large amplitude during normal operation of the machine. The disappearance or substantial diminution of these frequencies could then be detected and used to indicate operating status changes toward an abnormal condition.

As indicated above, the principles of the invention are not restricted to rod mills and could find application in numerous situations where an electric motor drives a machine and it is desired to detect predetermined operating conditions. For example, the mechanical connections between the motor and a machine might break and the motor would continue rotating without the machine doing any useful work. Of course the frequencies indicative of predetermined operating conditions of a machine would depend on the particular machine and what sort of operating conditions were to be detected.

The apparatus of FIG. 1 is given as a prime example of how the invention may be put to use.

Although the present invention has been described in conjunction with preferred embodiments, it is to be understood that modifications and variations may be resorted to without departing from the spirit and scope of the invention, as those skilled in the art will readily understand. Such modifications and variations are considered to be within the purview and scope of the invention and appended claims.

What is claimed is:

1. In the operation of a rod mill driven by an electric motor said rod mill having a plurality of rods for crushing ore, an improved method of monitoring said operation for incipient tangle of the rods comprising: predetermining a band of frequencies of relatively large amplitude associated with an incipient tangle of rods, deriving an electrical signal which is proportional to current drawn by the motor, and filtering out of said signal substantially all frequencies except those in the predetermined band, thereby enabling the detection of the occurrence of characteristic frequencies within the specific band of frequencies, and altering the process conditions in the rod mill to avoid incipient tangle of the rods.

2. A method as described in claim 1, wherein the characteristic band of frequencies associated with the incipient tangles of the rods is in the range of up to about 1 Hz.

3. In a motor driven rod mill having a plurality of rods for crushing ore, an apparatus for monitoring said rod mill for incipient tangle of the rods, said incipient tangle of the rods having associated therewith a specific band of frequencies of relatively large amplitude superimposed on the electrical current to said motor, comprising: means for deriving an electrical signal which is proportional to current drawn by the motor, electrically responsive means for filtering out of said signal substantially all frequencies except the specific band of frequencies associated with incipient tangle of the rods, said means for deriving the electrical signal feeding the input of the electrically responsive filtering means, and means for relaying the occurrence of frequencies within said specific characteristic band of frequencies.

4. Apparatus as claimed in claim 3 wherein the electrically responsive filtering means is sensitive to frequencies between about 0.2 and 1 Hz.

* * * * *